(12) United States Patent
Goerlich et al.

(10) Patent No.: US 8,938,364 B2
(45) Date of Patent: Jan. 20, 2015

(54) SENSOR DEVICE WITH SELF-TEST CAPABILITY

(75) Inventors: Patrick Goerlich, Reutlingen (DE); Riad Stefo, Reutlingen (DE); Wolfram Bauer, Tübingen (DE); Rainer Willig, Tamm (DE); Burkhard Kuhlmann, Reutlingen (DE); Mathias Reimann, Ditzingen (DE); Ermin Esch, Pliezhausen (DE); Michael Baus, Bietigheim-Bissingen (DE); Gregor Wetekam, Reutlingen (DE); Michael Veith, Reutlingen (DE); Emma Abel, Ostfildern (DE); Wolfgang Fuerst, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 355 days.

(21) Appl. No.: 12/803,910

(22) Filed: Jul. 9, 2010

(65) Prior Publication Data

US 2011/0066396 A1    Mar. 17, 2011

(30) Foreign Application Priority Data

Jul. 31, 2009   (DE) .......................... 10 2009 028 173

(51) Int. Cl.
*G01R 31/28*       (2006.01)
*G01D 18/00*       (2006.01)
*G06F 11/27*       (2006.01)
*G01D 3/08*        (2006.01)
*G01R 31/3185*     (2006.01)

(52) U.S. Cl.
CPC ............ *G01D 18/00* (2013.01); *G01R 31/2834* (2013.01); *G06F 11/27* (2013.01); *G01D 3/08* (2013.01); *G01R 31/318511* (2013.01)
USPC ................ 702/116; 702/32; 702/57; 702/83; 702/189; 702/193; 29/593

(58) Field of Classification Search
USPC ............................................. 702/116; 29/593
See application file for complete search history.

(56) References Cited

U.S. PATENT DOCUMENTS

| 5,900,529 | A  | * | 5/1999 | Hanisko et al. | ................. 73/1.38 |
| 6,564,637 | B1 | * | 5/2003 | Schalk et al. | ............... 73/504.12 |
| 2004/0187555 | A1 | * | 9/2004 | Zarabadi | ........................ 73/1.37 |
| 2004/0194532 | A1 | * | 10/2004 | Lally et al. | ...................... 73/1.82 |
| 2005/0039530 | A1 | * | 2/2005 | Schellin et al. | ............. 73/514.32 |
| 2005/0240374 | A1 | * | 10/2005 | Zarabadi | ....................... 702/141 |
| 2009/0019330 | A1 | * | 1/2009 | Friedrich et al. | ............... 714/733 |

* cited by examiner

*Primary Examiner* — Sujoy Kundu
*Assistant Examiner* — Paul D Lee
(74) *Attorney, Agent, or Firm* — Kenyon & Kenyon LLP (57) ABSTRACT

A sensor device includes: a sensor module mounted on a conductor board; a sensitive element which is sensitive to a variable; a self-test control unit implementing a self-test program, the self-test control unit applying a self-test variable to the sensitive element, taking the self-test program into account; a detection unit detecting a characteristic of the sensitive element which is altered as a result of the applied self-test variable and providing an actual self-test response, taking the altered characteristic into account; and a comparator unit provided on or in the sensor module, the comparator unit comparing the actual self-test response to at least one specified setpoint self-test response and providing comparative information.

13 Claims, 4 Drawing Sheets

SENSOR DEVICE WITH SELF-TEST CAPABILITY

BACKGROUND OF THE INVENTION

1. Field of the Invention

The present invention relates to a sensor device and a manufacturing method for a sensor device.

2. Description of Related Art

A sensor device for detecting a physical/chemical variable and/or for outputting appropriate information to a vehicle component generally has a sensor chip having at least one element which is sensitive to the physical/chemical variable. This type of sensor device is sometimes designed to carry out a self-test to check its internal structures, in particular the micromechanical system, of the sensitive element.

Figure 1:
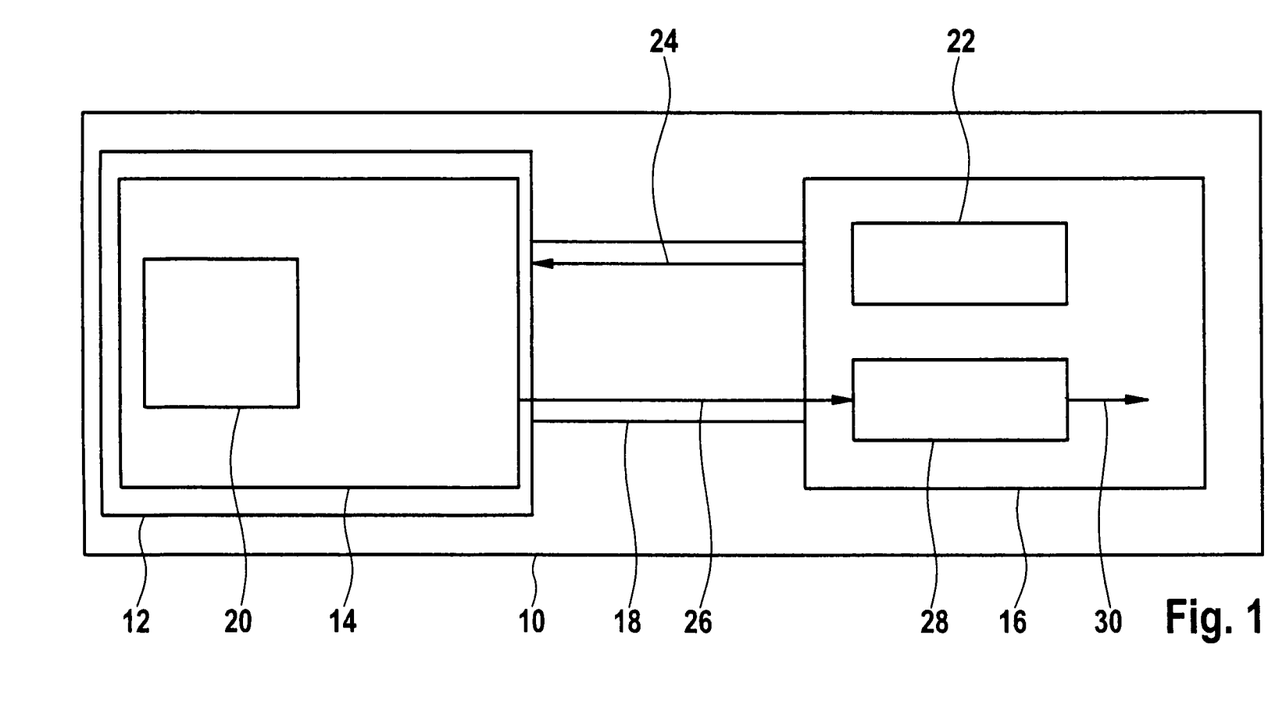
FIG. 1 shows a schematic illustration of a sensor device as an example.

FIG. 1 shows a schematic illustration of a sensor device as an example.

Sensor device 10 illustrated in FIG. 1 includes a sensor module 12 having at least one sensor chip 14, and a control module 16. Sensor module 12 is connected to control module 16 via an interface 18. At least one sensitive element 20 is provided on sensor chip 14. At least one characteristic of sensitive element 20, for example, a position of sensitive element 20 in relation to a housing of sensor device 10, may be altered when at least one variable changes in a spatial surrounding of sensor chip 14. Sensor device 10 is designed in such a way that the altered characteristic of sensitive element 20 may be detected, and a sensor signal corresponding to the variable may be output by sensor device 10.

A self-test logic unit 22 is situated on control module 16, and at least one self-test program is stored on the self-test logic unit. Self-test logic unit 22 is able to control sensor module 12, i.e., sensor chip 14, via interface 18 with the aid of a control signal 24 in such a way that a self-test variable is applied to sensitive element 20. Control signal 24 is transmitted from self-test logic unit 22 to sensor module 12 via interface 18. For a self-test, sensor module 12, i.e., sensor chip 14, is externally triggered. To measure the reaction of sensor chip 14, an actual self-test response 26 of sensitive element 20 may then be detected by sensor chip 14.

An actual self-test response 26 is also provided via interface 18 to a self-test evaluation unit 28 situated on control module 16. Self-test evaluation unit 28 is designed to compare actual self-test response 26 to at least one specified setpoint self-test response, and to output appropriate comparison information 30.

BRIEF SUMMARY OF THE INVENTION

In accordance with the present invention, the sensor module mounted on the conductor board is preferably a compact unit. The conductor board is preferably a printed circuit board. The sensor module may, for example, have encapsulation or a housing which may be affixed to the conductor board. The sensor module may include at least one chip. In one possible example embodiment, the sensitive element may be provided on a sensor chip of the sensor module, and the comparator may be provided on a control chip, in particular an ASIC. However, the micromechanical system of the sensitive element may also be integrated into the control chip.

The control module is preferably mounted on the conductor board, for example, a printed circuit board, at a distance from the sensor module. The control module may be a microcontroller (µC), for example. However, the control module which cooperates with the sensor module may also be provided externally to the sensor device. In this case the sensor device includes a data transmission device which is designed in such a way that signals/data may be transmitted between the data transmission device and the external control module.

A self-test variable is understood to mean, for example, a self-test force which is exerted on a sensitive element via an electrical stimulus. The variable with regard to which the sensitive element undergoes a state change may be at least one physical variable and/or one chemical variable.

The present invention is based on recognizing that integration of the evaluation logic for a self-test which may be automatically carried out on a control module which is separate from the sensor module requires considerable resources of the control module. In addition, in this case the duration of the evaluation of a self-test depends greatly on the speed of an interface via which the sensor module is connected to the control module, and on the speed of the control module itself. This may have an adverse effect on the evaluation time. In contrast, the present invention allows an evaluation concept within the sensor via which resources on the control module, a microcontroller, for example, may be conserved. This allows the use of a control module which is more cost-effective and/or which requires less space.

Integration of the control logic for a self-test which may be automatically carried out on a control module which is separate from the sensor module also requires considerable resources of the control module. In this case as well, the duration of a self-test is greatly affected by the speed of the interface and the speed of the control module. As a result, self-tests which may be automatically carried out generally take a comparatively long time. In addition, for such a design of the sensor module and control module it is not possible to start the self-test until both modules have been initialized. In this case, the control module is responsible for correctly conducting and evaluating the self-test which may be automatically carried out. Thus, the sensor module is not able to prevent operating errors or incorrect evaluations. To avoid this disadvantage, one refinement of the present invention allows self-test control which is within the sensor and which does not consume resources on the control module. For a combined control and evaluation concept within the sensor, a self-test may be started before the control module is initialized. Since the speed of the self-test is not adversely affected by an interface, the self-tests may be carried out more quickly. In addition, in this case it is not possible for an operating error of the sensor and evaluation module to result in improper execution of the automatic self-test, thus improving the robustness of the sensor device.

The advantages of a sensor device described in the preceding paragraphs are also ensured for a corresponding manufacturing method.

The present invention also allows a sensor device having a sensitive element, a self-test control unit (self-test sequence control unit), and a self-test execution unit, the self-test control unit and the self-test execution unit being situated on a common chip. At least one self-test program is implemented on the self-test control unit. The at least one self-test program is preferably implemented on the self-test control unit in such a way that at least two (self-test) control states of the sensitive element and a time sequence of the at least two (self-test) control states may be identified by the implemented self-test program. This may also be described in that the self-test control unit is designed in such a way that carrying out at least one self-test program having at least two (self-test) control states may be controlled by the self-test control unit in a fixed time sequence. In addition, the self-test control unit is designed in such a way that at least one control signal may be output to the self-test execution unit with the aid of the self-test control unit, taking the at least one implemented self-test program into account. The self-test execution unit is designed in such a way that at least one physical or chemical self-test variable (a physical stimulus, for example) may be applied to the sensitive element with the aid of the self-test execution unit, taking into account a control signal which is output by the self-test control unit. The sensor device may also include a detection unit which is designed in such a way that a characteristic of the sensitive element which is altered as a result of the applied self-test variable may be detected by the detection unit, and an actual self-test response may be provided, taking the altered characteristic into account, and/or may include a comparator unit which is designed in such a way that the actual self-test response may be compared to at least one specified setpoint self-test response with the aid of the comparator unit, and comparative information may be provided, taking into account the comparison of the actual self-test response to the at least one setpoint self-test response.

DETAILED DESCRIPTION OF THE INVENTION

Figure 2:
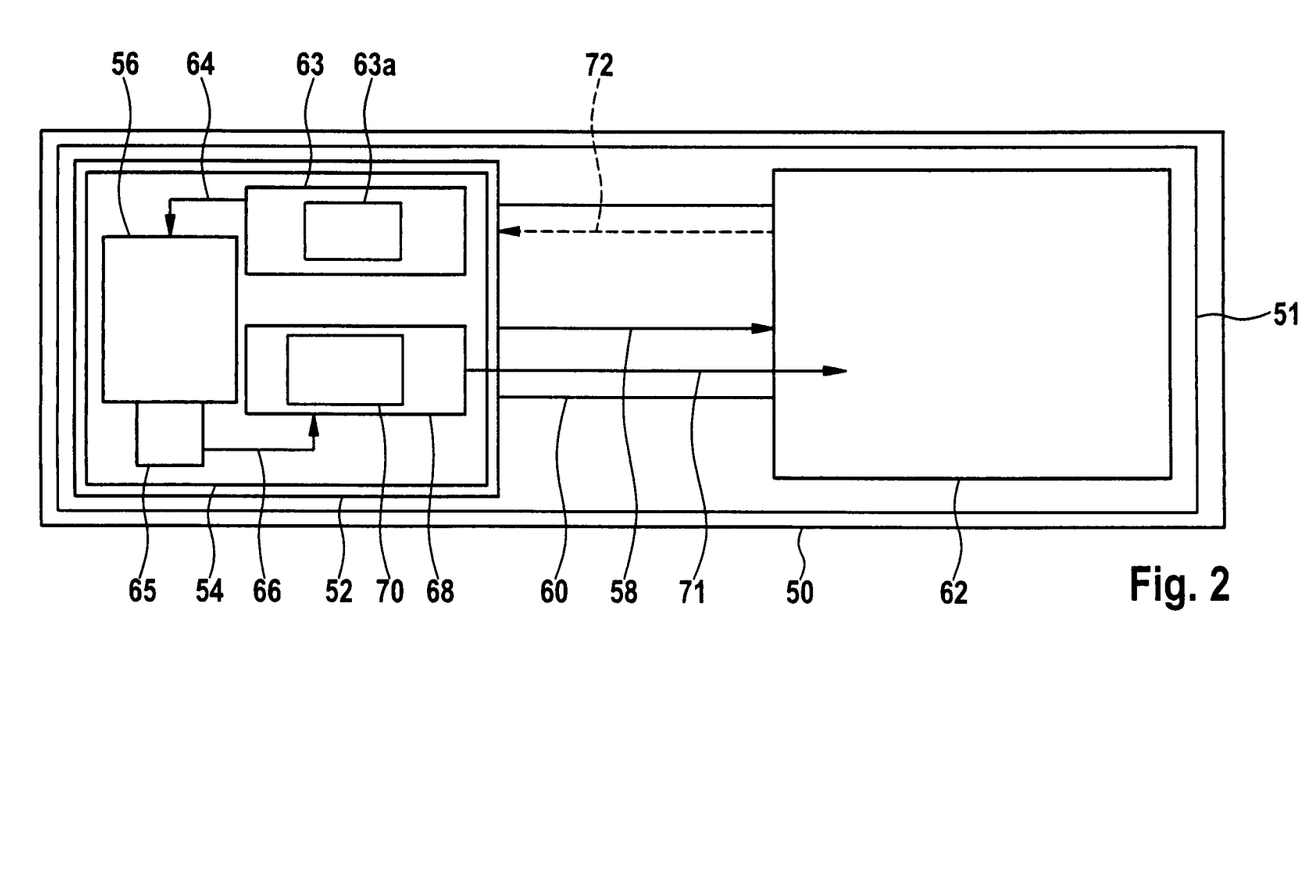
FIG. 2 shows a schematic illustration of a first specific embodiment of the sensor device.

FIG. 2 shows a schematic illustration of a first example embodiment of the sensor device.

Sensor device 50 schematically illustrated in FIG. 2 is designed to identify information regarding at least one variable. The variable for which information may be identified/ascertained by sensor device 50 may be at least one physical variable and/or one chemical variable. Sensor device 50 may be designed in particular to detect a measured value for the variable. The variable which may be detected by sensor device 50 may be, for example, an acceleration, a rotational rate, a temperature, a substance concentration, and/or a pressure. However, it is noted that sensor device 50 further described below is not limited to detecting such a variable. Sensor device 50 may also be designed for detecting some other variable.

Sensor device 50 includes a printed circuit board 51 and a sensor module 52 mounted on printed circuit board 51. The sensor module preferably has at least one chip, for example, sensor chip 54. Printed circuit board 51 may be a motherboard of sensor device 50. Sensor module 52 may have encapsulation or an independent housing in which the at least one sensor chip 54 is situated. Sensor module 52 is preferably understood to mean a compact unit which is already provided in a one-piece design before sensor module 52 is affixed to printed circuit board 51. Sensor device 50 is not limited to use of a single sensor chip 54. Sensor device 50 may also have multiple sensor chips 54, which preferably are situated in common sensor module 52. In addition to the at least one sensor chip 54, at least one other chip, a control chip, for example, may be situated on or in sensor module 52.

In the example embodiment described here, printed circuit board 51 is used as a conductor board. However, it is noted that sensor device 50 further described below is not limited to a conductor board which is designed as a printed circuit board 51. Sensor device 50 may include at least one additional conductor board as an alternative or supplement to printed circuit board 51.

At least one sensitive element 56 is provided on the at least one sensor chip 54. Sensitive element 56 may have a micromechanical design, for example. A sensitive element 56 is understood to mean a subunit of sensor chip 54 for which at least one characteristic may be altered as a result of the at least one physical and/or chemical variable to be detected by sensor device 50. Examples of characteristics of sensitive element 56 which may be altered as a result of the variable include the position of the sensitive element in relation to an immovable unit of sensor chip 54 and/or of a housing of sensor device 50. The at least one sensitive element 56 may include at least one seismic mass and/or at least one pressure chamber, for example. However, sensor device 50 is not limited to such a sensitive element 56. Sensor device 50 may thus also include a sensitive element 56 having another design.

In the example embodiment illustrated, sensor module 52 is connected via an interface 60 to a control module 62 which is mounted on printed circuit board 51. Control module 62 and/or sensor module 52 may be fixedly soldered and/or plugged to printed circuit board 51, for example.

Interface 60 may be a digital interface 60, for example, via which an electrical PIN and/or a digital command may be transmitted. Components for controlling sensor module 52 and/or for evaluating information detected at sensor module 52 may be provided on control module 62. Control module 62, which may also be referred to as a controller, may be an (external) processor or an (external) microcontroller. Control module 62 may, for example, include at least one chip on which at least one circuit is provided for controlling sensor module 52 and/or for evaluating information detected at sensor module 52.

It is noted that described sensor device 50 is not limited to a design in combination with control module 62. The functions performed by the control module may also be carried out by an external control module. In this case, sensor device 50 may have a data transmission unit for transmission of data by the external control module. The external control module may, for example, be a component of a central control and/or evaluation device in the vehicle itself. Thus, the sensor device may be easily implemented with comparatively low space requirements.

Sensor device 50 may include a sensor and evaluation unit (not illustrated) which is designed to detect the characteristic of sensitive element 56 which has been altered due to a change in the variable over time, and to identify the information concerning the variable, taking the detected altered characteristic into account. In one specific exemplary embodiment, at least one subunit (not illustrated) of the sensor and evaluation unit situated in sensor module 52 is able to detect the altered characteristic of sensitive element 56 and to output an appropriate sensor signal 58. Sensor signal 58 is preferably a signal which may be electrically evaluated. Sensor signal 58 may then be evaluated by at least one further subunit (not illustrated) of the sensor and evaluation unit which is situated on control module 62 or on an external control module, for example. In this case, sensor signal 58 is output via interface 60 to control module 62 or to the data transmission unit. In addition to ascertaining the information concerning the variable, control module 62 may also be designed to control a vehicle component and/or a display unit in the vehicle itself for indicating the measured variable, taking received sensor signal 58, i.e., the ascertained information concerning the variable, into account. Control module 62 may also output the ascertained information concerning the variable to a further component.

Sensor device 50 described further below is not limited to a design of the sensor and evaluation unit corresponding to the preceding paragraph. The individual components of the sensor and evaluation unit may also be situated, for example, on other components of sensor device 50.

Sensor device 50 schematically illustrated in FIG. 2 is designed for carrying out a self-test. The self-test is preferably carried out automatically by sensor device 50. In the self-test, the internal structures of sensor module 52 and/or of sensor chip 54, in particular the micromechanical system of sensitive element 56, may be tested for possible damage during operation of sensor device 50, and/or for possible aging damage.

Sensor device 50 has a self-test control unit 63 for (automatically) carrying out the self-test. Self-test control unit 63 is designed to apply a self-test variable 64 to sensitive element 56 during the self-test, taking at least one specified self-test program into account. Self-test variable 64 may be a self-test force. Self-test variable 64 which is applied while carrying out the self-test program may remain constant over time, or may have a setpoint variation which is not constant over time. The application of self-test variable 64 may, for example, include an application of at least one electrical stimulus to sensitive element 56. Self-test variable 64 which is applied to sensitive element 56 is selected in such a way that a characteristic of sensitive element 56 which is altered as the result of applied self-test variable 64, for example, a change in position, may be detected with the aid of a detection unit 65, and an appropriate actual self-test response 66 may be provided.

Actual self-test response 66 is understood to mean information concerning a characteristic of sensitive element 56 which is altered as the result of applied self-test variable 64. If sensitive element 56 is a seismic mass, a portion of sensitive element 56 may be designed as an actuator electrode which may be displaced, with respect to a stator electrode which is fixedly connected to sensor chip 54, as a result of self-test variable 64. Thus, for example, actual self-test response 66 may be a change in capacitance of a capacitor formed by the two electrodes.

Self-test control unit 63 includes a subunit, which may be referred to as a control logic subunit 63a, on which the at least one self-test program is implemented. Implementation of the at least one self-test program may also be understood to mean storage of the at least one self-test program on control logic subunit 63a. Control logic subunit 63a is preferably situated on or in sensor module 52. In one particularly advantageous specific embodiment, self-test control unit 63 is designed in particular as a compact unit on or in sensor module 52.

A self-test program carried out by self-test control unit 63 may include a single test, a test sequence, and/or multiple test sequences. A test sequence may, for example, include a positive self-test, a zero self-test (no self-test stimulus), and a negative self-test in any given sequence. Thus, a great variety of self-test programs may be automatically carried out in sensor device 50 described here. Examples of a self-test which may be carried out are addressed in greater detail in the description of FIG. 3.

At least one of the self-test programs is preferably implemented on control logic subunit 63a of sensor module 52 in such a way that at least two subprograms having differing setpoint variations over time of self-test variable 64 which is applied to sensitive element 56, and having a setpoint sequence of the at least two subprograms when the self-test program is carried out on the subunit, are implemented for the self-test program. The test program in question thus includes multiple method steps in which self-test variable 64 is altered in a targeted manner from at least one initial setpoint value to an end setpoint value. The initial setpoint value and the end setpoint value are preferably understood to mean in each case a self-test variable 64 to be applied by the self-test control unit 63, and not a force resulting from a deactivation or activation of self-test control unit 63. For example, in a first subprogram self-test variable 64 may be increased to a positive maximum value, and in a second subprogram may be increased to a negative maximum value. The implemented program also specifies the time sequence of the at least two method steps. For example, the implemented program specifies the time sequence of multiple (electrical) stimuli applied to sensitive element 56.

A comparator unit 68 is provided on or in sensor module 52 for evaluating actual self-test response 66 provided by detection unit 65. Comparator unit 68 is linked to a memory unit 70 on which at least one specified setpoint self-test response is implemented/stored. Memory unit 70 is preferably likewise provided on or in sensor module 52. In this case, the at least one setpoint self-test response used for evaluating actual self-test response 66 is not provided via an interface 60 to comparator unit 68. This speeds up the evaluation of actual self-test response 66. Memory unit 70 may in particular be a subunit of comparator unit 68.

Comparator unit 68 is designed to compare the at least one actual self-test response 66 to the at least one provided setpoint self-test response, and to provide comparative information 71, taking into account the comparison of actual self-test response 66 to the at least one setpoint self-test response. Comparator unit 68 is preferably designed to output an appropriate error message as comparative information 71 if the at least one detected actual self-test response 66 differs from the at least one provided setpoint self-test response by at least a specified minimum deviation. Comparative information 71 may be output, for example, to control module 62 via interface 60.

Instead of an error message, after each comparison and/or after a specified number of comparisons, a comparison result may be output as comparative information 71 to control module 62. The error message and/or the comparison results may be stored on an external memory which may be scanned by a service facility.

The at least one setpoint self-test response which is stored/implemented on memory unit 70, and which may be at least one target value, for example, may be specifically stored for particular sensor module 52 on memory unit 70 before start-up. It is particularly advantageous when the at least one setpoint self-test response is specified as a function of at least one characteristic of sensor module 52 and/or of associated sensor chip 54, i.e., of sensitive element 56 to be tested. This is ensured by storing, during manufacture of sensor module 52, at least one measured actual self-test response 66 or an average value from measured actual self-test responses 66 on memory unit 70 as the at least one setpoint self-test response. Similarly, the minimum deviation (tolerance) may be specifically predetermined on each sensor module 52.

As an alternative to storing the at least one setpoint self-test response and/or the minimum deviation during manufacture of sensor module 52, at least one of these comparative values may also be specified for comparator unit 68 by an input device, for example, a user of sensor device 50 or an internal controller, or stored on memory unit 70. This may be carried out every time sensor module 52 is started, or on a one-time basis. In particular, the input device may be designed to provide the at least one setpoint self-test response and/or the minimum deviation, taking into account a state of sensor device 50, of the associated vehicle, a traffic situation, and/or an environmental condition. In this case, these factors may be taken into account in the evaluation of actual self-test response 66.

A self-test program which is carried out by self-test control unit 63 may be started, for example, by a start signal 72 which is output by control module 62 via interface 60. This may also be described in that self-test control unit 63 is switched from an inactive mode to a self-test mode by start signal 72. However, sensor device 50 described here is not limited to an initialization of a self-test by such a start signal 72.

In one particularly advantageous example embodiment, self-test control unit 63 is designed to initialize itself in order to carry out a self-test. In another advantageous specific embodiment, another component of sensor module 52 may initialize self-test control unit 63 at a specified point in time in order to carry out a self-test. The specified point in time advantageously is within a specified time interval/after the specified time interval shortly after switching on/activation of sensor module 52, i.e., sensor chip 54, is recognized by self-test control unit 63 or by the other component of sensor module 52. In this preferred case, sensor device 50 is designed in such a way that when sensor module 52, i.e., sensor chip 54, is activated, self-test control unit 63 automatically carries out at least one self-test. Before sensor module 52, in particular sensitive element 56, is used, a check may thus be made to determine whether the desired functionality is ensured during use.

In another advantageous example embodiment, self-test control unit 63 is designed to carry out a self-test in a specified rhythm or taking into account a specified interval between self-tests, for example, every two seconds. Self-test control unit 63 may in particular have a signal input via which an advantageous rhythm/preferred interval between self-tests for carrying out successive self-tests of a state recognition unit of a vehicle is specified. The rhythm or interval between self-tests which is used to automatically check in particular the state of sensitive element 56 may thus be specified, taking into account a state of sensor device 50, of the associated vehicle, a traffic situation, and/or an environmental condition.

Thus, on the basis of automatic self-testing or internal checks (status flags), sensor device 50 described here is able to indicate when it is completely initialized and ready for operation. In particular, sensor module 52 is able to recognize when an advantageous state is ensured for carrying out a self-test. Linking a start of the self-test to an initialization of sensor module 52 allows the quickest possible start of sensor module 52, including at least one self-test which is carried out.

The example embodiments described in the preceding paragraphs may also be combined. For example, after the sensor has been successfully started, it may be specified that a predetermined time interval is maintained before a self-test sequence is started. This may be repeated within a specified rhythm, for example, every two seconds.

The self-test which has just been carried out may be repeated, and/or another self-test may be started, as a function of the evaluation of an actual self-test response 66 by comparator unit 68. This may be achieved, for example, by designing comparator unit 68 to actuate self-test control unit 63 to repeat the self-test which has just been carried out and/or to carry out another self-test after determination of a deviation between an actual self-test response 66 and the at least one setpoint self-test response by more than the specified minimum deviation. Brief disturbances, for example as the result of external interfering influences such as mechanical overload, are thus not able to result in failure of the self-tests as a whole. If comparator unit 68 recognizes that actual self-test response 66 or a specified number of actual self-test responses 66 matches the at least one setpoint self-test response within the specified minimum deviations, the repetitions of the self-tests may be terminated. Likewise, the repetitions of the self-tests may be terminated as soon as a specified maximum number of self-tests to be successively carried out is exceeded.

In one example embodiment of sensor device 50, components 63, 65, 66, and 70 are provided on or in sensor module 52. Thus, it is not necessary to relay a signal via interface 60 in order to carry out the individual method steps of a self-test. All method steps of the self-test may thus be carried out in a comparatively short time. The time specified for carrying out the self-test is preferably such that the first correct response of a self-test may be evaluated on account of this time being short. The total duration of a self-test sequence and/or of multiple self-test sequences may thus be kept comparatively short. Thus, the entire self-test process may be carried out within a short period of time. In the example embodiment, due to its comparatively short duration, an actual self-test response 66 may be easily filtered from the useful signals, using a low-pass filter, for example.

In one advantageous refinement, sensor module 52 is also designed to indicate a self-test state to control module 62 via interface 60 for as long as a self-test is carried out. In this case, while a self-test is carried out, control module 62 has information that sensor signals 58 provided at that moment may possibly be adversely affected by the self-test which has just been carried out. This is advantageous in particular for an automatic initialization of a self-test by a component of sensor module 52.

In the illustrated example embodiment of sensor device 50, components 63, 65, 66, 68, and 70 are situated/provided on sensor chip 54. However, sensor module 52 described here is not limited to such a design. Components 63, 65, 66, 68, and 70 may also be situated/provided, for example, on a control chip of sensor module 52. The control chip may be an ASIC. Sensitive element 56, which may be controlled using the control chip, may be provided on sensor chip 54. However, for the sake of clarity, the control chip is not illustrated in FIG. 2.

As a micromechanical system, sensor chip 52 may also be integrated into the control chip, which is designed as an ASIC, for example. This specific embodiment also ensures the advantages described above.

In sensor device 50 schematically illustrated in FIG. 2, no resources of control module 62 are consumed for controlling a self-test or for implementing an execution logic system for a self-test. The resources of control module 62 may therefore be employed for a variety of other uses of sensor device 50.

Sensor device 50 described in the preceding paragraphs is preferably a combined rotational rate sensor and acceleration sensor having a digital serial interface 60 which is designed as an SPI. Thus, as a result of the specific implementation described above, this type of sensor device 50 may be designed for an automatic self-test sequence having control and evaluation within the sensor.

A sensor device having a sensitive element, a self-test control unit (self-test sequence control unit), and a self-test execution unit is also apparent from FIG. 2, the self-test control unit and the self-test execution unit being situated on a common chip. The self-test control unit and the self-test execution unit may, for example, be components of self-test control unit 63. The self-test control unit in particular may be designed as a control logic subunit 63*a*. Therefore, this type of sensor device is not further discussed.

Figure 3:
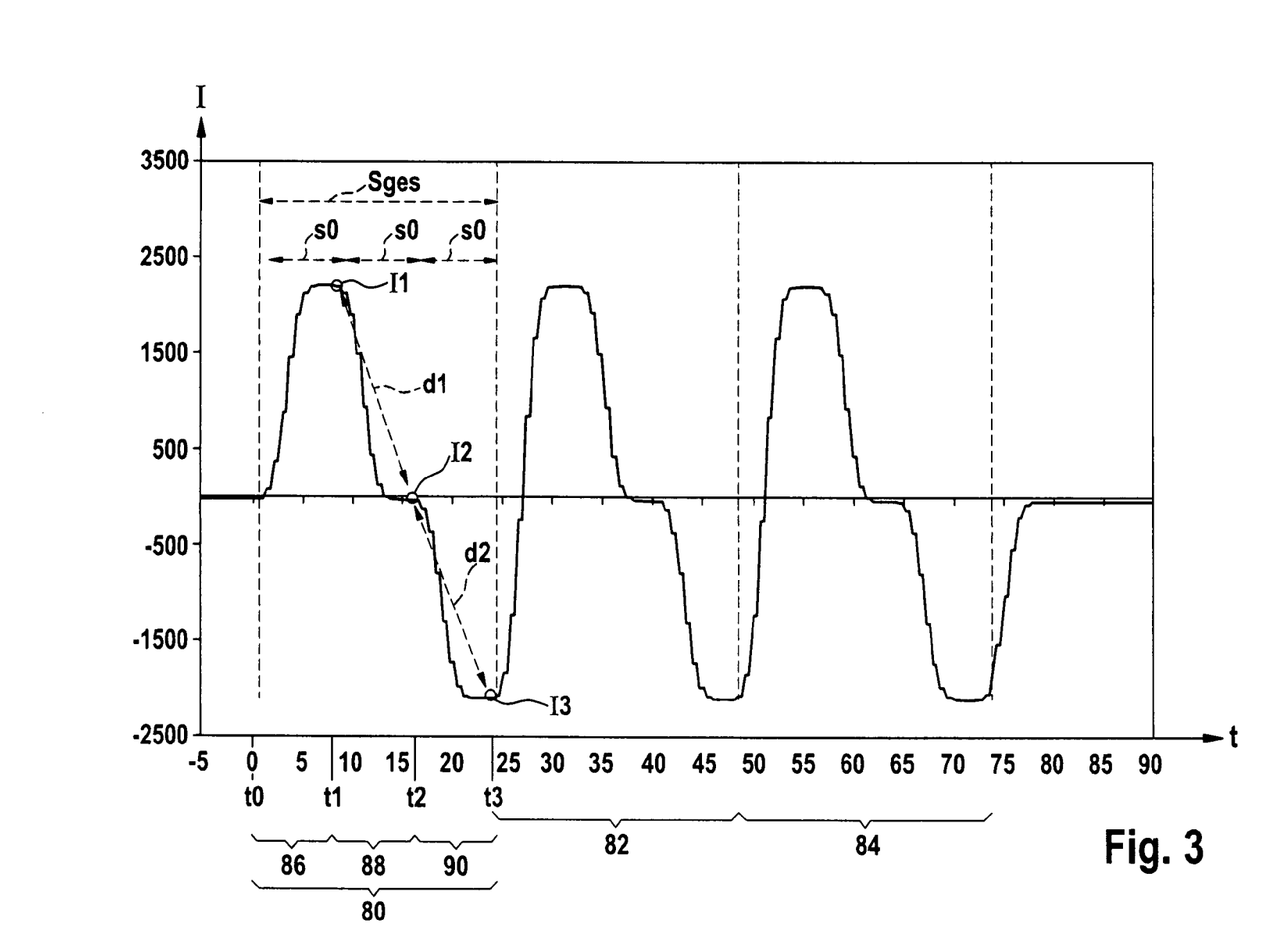
FIG. 3 shows a coordinate system for illustrating a second specific embodiment of the sensor device.

FIG. 3 shows a coordinate system for illustrating a second example embodiment of the sensor device.

The sensor device represented on the basis of the coordinate system of FIG. 3 may have a structure corresponding to FIG. 2. Therefore, the structure of the sensor device is not discussed here. The sensor device is designed to carry out the progression of three self-test sequences 80 through 84 represented in the coordinate system of FIG. 3. The abscissa of the coordinate system corresponds to time axis t (in milliseconds). The ordinate of the coordinate system indicates the signal intensities I of the actual self-test response ascertained at the particular points in time.

Self-test sequences 80 through 84 described below each have a duration Sges of 24 ms. However, shorter or longer durations Sges may be selected for self-test sequences 80 through 84 which are automatically carried out by a sensor device.

A first self-test sequence 80 is started at a point in time t0. Starting of first self-test sequence 80 may be initialized, for example, after a sensor module/sensor chip is activated by a component of the sensor module/sensor chip.

Within a first step 86 of first self-test sequence 80, having a duration s0 of 8 ms, a first self-test variable is applied to the sensitive element. The first self-test variable is specified in such a way that a characteristic of the sensitive element is deflected in a first (positive) direction. If the sensitive element responds correctly to the first self-test variable, after first step 86 a maximum positive self-test response signal I1 may be detected by the detection unit at point in time t1.

In a second method step 88 of first self-test sequence 80, the self-test variable applied to the sensitive element is reduced. Second method step 88 may preferably have duration s0. After second method step 88, a zero self-test signal I2 may thus be detected at point in time t2 if the sensitive element has responded correctly.

During a third method step 90 of first self-test sequence 80, a second self-test variable which is different from the first self-test variable is applied to the sensitive element. The second self-test variable may be applied in such a way that the characteristic of the sensitive element is deflected in a second (negative) direction. Third method step 90 may also have duration s0. At a point in time t3, at which third method step 90 is ended, a maximum negative self-test response signal I3 may preferably be detected.

The detection unit is designed to determine a first difference d1 from zero self-test signal I2 and positive self-test signal I1, and to determine a second difference d2 from negative self-test signal I3 and zero self-test signal I2, and to output same to the comparator unit as an actual self-test response. The comparator unit compares differences d1 and d2 to at least one comparative value which is provided as a setpoint self-test response. The functionality of the sensor module and/or of the sensor chip, in particular of the sensitive element, may be checked on the basis of these comparisons.

If the evaluations of differences d1 and d2 do not result in deviations from the specified comparative value above a minimum deviation, the self-test is considered to be passed. If deviations in differences d1 and d2 from the specified comparative value by more than the specified tolerances are determined, first self-test sequence 80 may be repeated at least once. If satisfactory agreement of differences d1 and d2 with the specified comparative value is not determinable even after a second self-test sequence 82 and a third self-test sequence 84, an error message and/or a negative status flag may be output to a unit of the sensor device, for example, to the control module. Alternatively or additionally, an error message and/or a negative status flag may be output to an external device.

Carrying out self-test sequences 80 through 84 described here, in combination with the comparatively short times in which the individual self-tests may be carried out using the preferred system of the self-test control unit and the comparator unit on or in the sensor module, results in the advantage that low-frequency (slowly changing) interference has no significant influence on the self-test evaluation. Although low-frequency interference may possibly change the positive self-test response (positive self-test signal I1), the negative self-test response (negative self-test signal I3), and the zero self-test response (zero self-test signal I2), this change may be reliably filtered out by the difference formation.

In one refinement, the sensor device may include multiple sensor channels, for example, at least one acceleration channel and at least one rotational rate channel. A self-test may be carried out for each of the channels, using the methods described here, while achieving the stated advantages. In particular, the methods described in the preceding paragraphs may be used on the multiple channels simultaneously, in a time-delayed manner, or in succession. The sequences of the self-tests which are carried out may be the same, or inverted. One embodiment option includes a first self-test for a first channel, using a positive self-test, a zero self-test, and a subsequent negative self-test, and at least one second self-test for a second channel, using a negative self-test, a zero self-test, and a final positive self-test.

Figure 4:
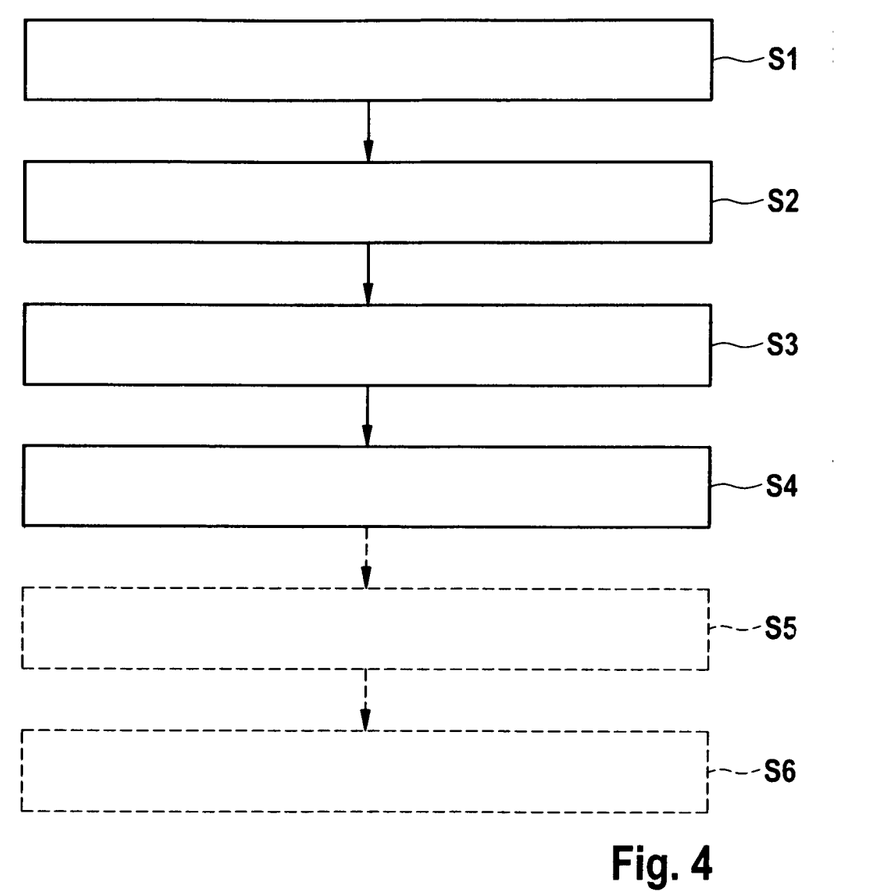
FIG. 4 shows a flow chart for illustrating one specific embodiment of the manufacturing method for a sensor device.

FIG. 4 shows a flow chart for illustrating one example embodiment of the manufacturing method for a sensor device.

In a method step S1 a sensor module is mounted on a printed circuit board of the sensor device. The sensor module is mounted in such a way that a characteristic of at least one element which is sensitive to at least one physical and/or chemical variable may be altered as a result of the at least one variable, and that during operation of the sensor device a sensor signal corresponding to the variable may be output on the basis of the response of the sensitive element to a change in the variable.

In a further method step S2, a self-test control unit on which at least one self-test program is implemented is provided. The provision may be understood to mean formation of the self-test control unit or placement of the finished self-test control unit in the sensor device. The implementation of the self-test program may also be storage of the self-test program on a memory device. Examples of a suitable self-test program have been previously stated in the description of the preceding figures. The self-test control unit is designed in such a way that in a self-test of the sensor device, a self-test variable is applied to the sensitive element by the self-test control unit, taking the at least one self-test program into account. The self-test control unit formed in method step S2 is preferably situated on or in the sensor module.

In a method step S3, a detection unit is provided in such a way that in the self-test of the sensor device a characteristic of the sensitive element which is altered as a result of the applied self-test variable is detected by the detection unit, and the detection unit provides an actual self-test response, taking the altered characteristic into account. The altered characteristic may be, for example, a position of the sensitive element which is changed as the result of the applied self-test variable. The detection unit may be formed or situated on or in the sensor module.

In addition, in a method step S4 a comparator unit is provided, which is designed in such a way that in the self-test of the sensor device the comparator unit compares the actual self-test response to at least one specified setpoint self-test response, and provides comparative information, taking the comparison of the actual self-test response to the at least one setpoint self-test response into account. The comparator unit provided in method step S4 is situated on or in the sensor module. The advantages stated above may be achieved in this way.

A memory unit may be provided in an optional method step S5. The memory unit provided in method step S5 may also be situated on or in the sensor module. The memory unit is linked to the comparator unit in such a way that in the self-test of the sensor device, at least one comparative information item stored on the memory unit is specified as at least one setpoint self-test response of the comparator unit.

In another optional method step S6, for specifying the at least one setpoint self-test response, at least one ascertained actual self-test response may be stored as comparative information on the memory unit. The setpoint self-test response may thus be easily determined specifically for the sensitive element to be checked in the self-test.

Method steps S1 through S6 described in the preceding paragraphs may be carried out in any given sequence. The numberings do not dictate a sequence of method steps S1 through S6.

A manufacturing method for a sensor device having a sensitive element, a self-test control unit (self-test sequence control unit), and a self-test execution unit is also explained with reference to FIG. 4, the self-test control unit and the self-test execution unit being situated on a common chip. Therefore, such a manufacturing method is not further described here.

What is claimed is:

1. A sensor device, comprising:
   a conductor board;
   a sensor module mounted on the conductor board, said sensor module including at least one sensitive element which is sensitive to a variable;
   a self-test control unit configured to implement at least one self-test program, wherein the self-test control unit is configured to apply a self-test variable to the sensitive element, taking the at least one self-test program into account;
   a detection unit configured to (a) detect a characteristic of the sensitive element altered as a result of the applied self-test variable, and (b) provide a self-test response, taking the altered characteristic into account; and
   a comparator unit configured to (a) compare the self-test response to at least one specified setpoint self-test response, and (b) provide comparative information, taking into account the comparison of the self-test response to the at least one setpoint self-test response, wherein the comparator unit is provided one of on or in the sensor module,
   wherein the detection unit determines a first difference from a first self-test signal and a second self-test signal, and determines a second difference from the first self-test signal and a third self-test signal, wherein each of the self-test signals correspond to the self-test variable applied to the sensitive element,
   wherein the comparator unit compares the first difference and the second difference to the at least one setpoint self-test response.

2. The sensor device as recited in claim 1, wherein at least one subunit of the self-test control unit is provided one of on or in the sensor module.

3. The sensor device as recited in claim 2, wherein the at least one self-test program is implemented on the subunit in such a way that at least two subprograms are implemented for the self-test program, the at least two subprograms having (a) differing setpoint variations over time of the self-test variable that is applied to the sensitive element, and (b) having a setpoint sequence of the at least two subprograms when the at least one self-test program is implemented on the subunit.

4. The sensor device as recited in claim 2, further comprising:
   a memory unit provided one of on or in the sensor module, wherein the at least one specified setpoint self-test response is stored on the memory unit, and wherein the memory unit is linked to the comparator unit in such a way that the at least one specified setpoint self-test response which is stored on the memory unit is output to the comparator unit.

5. The sensor device as recited in claim 2, wherein multiple self-test programs are implemented, and wherein the self-test control unit is configured to automatically apply the self-test variable to the sensitive element, taking into account at least one of the implemented self-test programs, and at least one of (a) taking into account a specified interval between self-tests, and (b) after a specified time interval after activation of the sensor module by the self-test control unit is recognized.

6. The sensor device as recited in claim 2, wherein the sensor device includes a control module mounted on the conductor board, the control module being linked to the sensor module via an interface.

7. The sensor device as recited in claim 6, wherein the control module is configured to output a start signal, and wherein the self-test control unit is configured to be switched from an inactive mode into a self-test mode with the aid of the start signal output by the control module.

8. The sensor device as recited in claim 6, wherein at least one of the sensor module and the control module is at least one of fixedly soldered and plugged to the conductor board.

9. The sensor device as recited in claim 2, wherein the at least one sensitive element is at least one of a seismic mass and a pressure chamber.

10. The sensor device as recited in claim 1, wherein the detection unit outputs the second difference to the comparator unit as an actual self-test response.

11. A method for performing a self-test on a sensor device, comprising:
   mounting a sensor module on a conductor board, said sensor module including at least one sensitive element which is sensitive to a variable;
   providing a self-test control unit configured to implement at least one self-test program, wherein the self-test control unit is configured to apply in a self-test of the sensor device a self-test variable to the sensitive element, taking the at least one self-test program into account;
   providing a detection unit configured to perform the following in the self-test:
      (a) detect a characteristic of the sensitive element altered as a result of the applied self-test variable, and
      (b) provide a self-test response, taking the altered characteristic into account; and providing a comparator unit configured to perform the following in the self-test:
      (a) compare the self-test response to at least one specified setpoint self-test response, and
      (b) provide comparative information, taking into account the comparison of the self-test response to the at least one setpoint self-test response, wherein the comparator unit is provided one of on or in the sensor module, wherein the detection unit determines a first difference from a first self-test signal and a second self-test signal, and determines a second difference from the first self-test signal and a third self-test signal, wherein each of the self-test signals correspond to the self-test variable applied to the sensitive element, wherein the comparator unit compares the first difference and the second difference to the at least one setpoint self-test response.

12. The method as recited in claim 11, wherein a memory unit is provided one of on or in the sensor module, and wherein the memory unit is linked to the comparator unit in such a way that in the self-test of the sensor device at least one comparative information item stored on the memory unit is specified as at least one setpoint self-test response of the comparator unit.

13. The method as recited in claim 12, wherein for specifying the at least one setpoint self-test response, at least one ascertained actual self-test response is stored as the comparative information on the memory unit.

\* \* \* \* \*